United States Patent [19]

Spodati et al.

[11] Patent Number: 4,709,979
[45] Date of Patent: Dec. 1, 1987

[54] SYSTEM FOR THE CONNECTION OF PHOTODETECTORS TO OPTICAL FIBERS

[75] Inventors: Fabrizio Spodati, Ospitaletto Di Cormano Milan; Mario Tamburello, Milan, both of Italy

[73] Assignee: Telettra-Telefonia Elettronica e Radio S.p.A., Italy

[21] Appl. No.: 663,240

[22] Filed: Oct. 22, 1984

[30] Foreign Application Priority Data

Nov. 4, 1983 [IT] Italy ................ 23587 A/83

[51] Int. Cl.$^4$ ............................ G02B 6/36; G02B 7/26
[52] U.S. Cl. ................................ 350/96.20; 350/96.21
[58] Field of Search ................ 350/96.20, 96.21, 96.17

[56] References Cited

U.S. PATENT DOCUMENTS 4,302,070 11/1981 Nakayama et al. ............ 350/96.22

Primary Examiner—William L. Sikes
Assistant Examiner—Robert E. Wise
Attorney, Agent, or Firm—Ostrolenk, Faber, Gerb & Soffen

[57] ABSTRACT

A system for the alignment and assembly of optical fibers to photodetectors in a hermetic package with a glass window and without fiber tail. One end of an optical fiber is terminated with an optical fiber support member. A support plate is provided with two concentric seats on opposite faces of the plate. A photodetector is inserted into one of the seats, and the connector part is inserted into the other seat. Synthetic resins are used to secure the photodetector and connector part to their respective plate seats.

7 Claims, 8 Drawing Figures

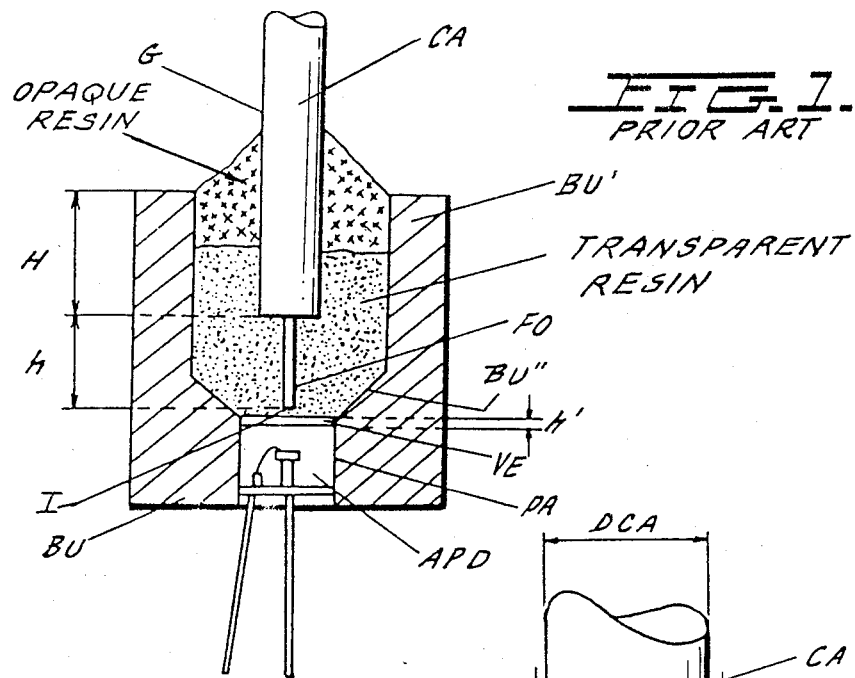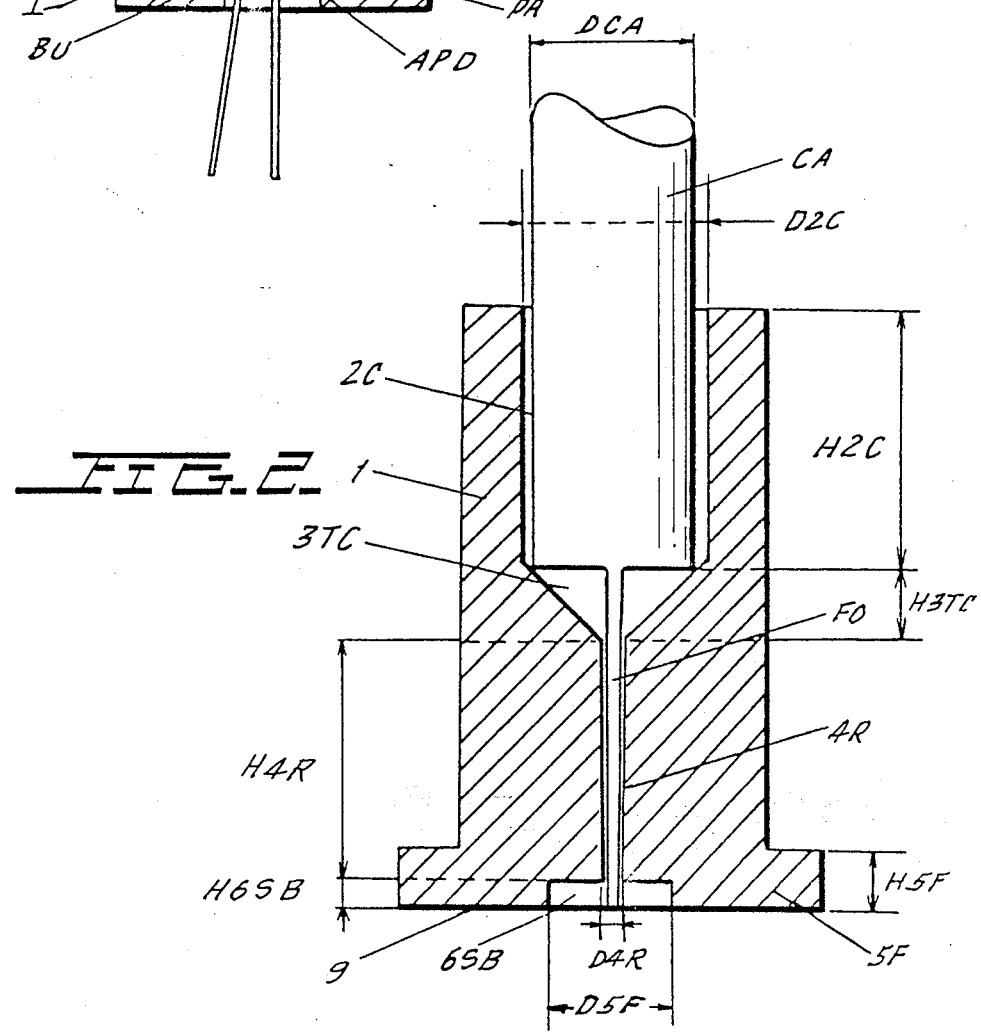

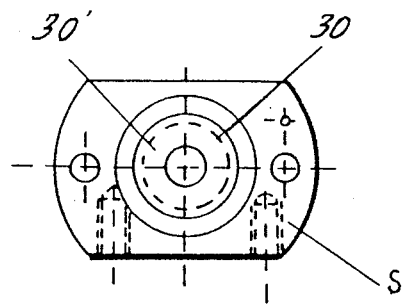
FIG._4A.
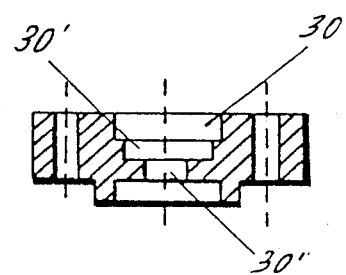
FIG._4B.
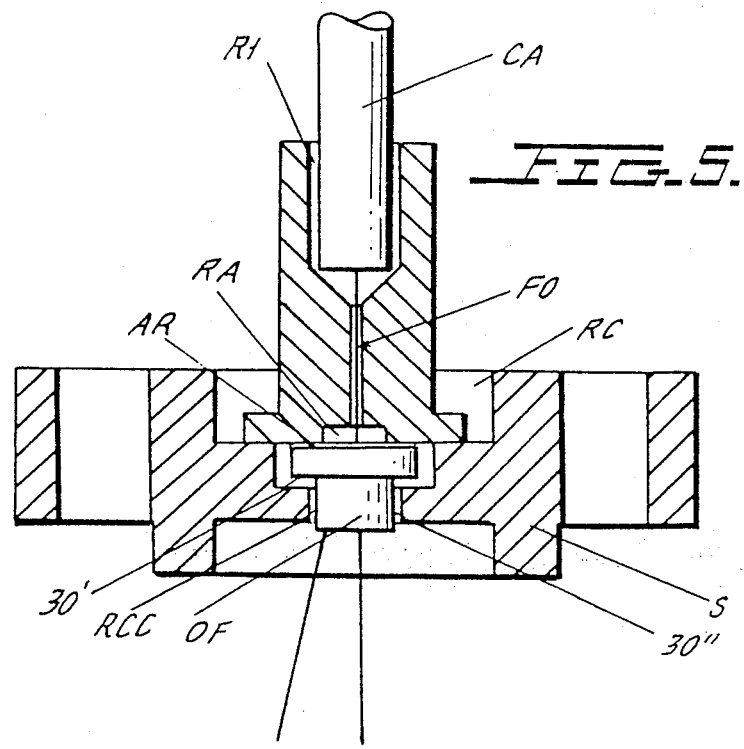
FIG._5.

SYSTEM FOR THE CONNECTION OF PHOTODETECTORS TO OPTICAL FIBERS

FIELD OF THE INVENTION

The present invention relates to a system for the connnection between a photodetector and an optical fiber, and in particular for the alignment and assembly of an optical fiber with a photodetector in a hermetic package with a glass window and with a fiber leader.

BACKGROUND OF THE INVENTION

As is well-known, the success of an optical fiber transmission system used in communications is related to the availability of solid state sources and detectors. Such detectors must be efficient, reliable and inexpensive and may be of a type APD (avalance photodiode), typically assembled in a hermetic package without a fiber leader. The optical fiberphotodetector assembly must posses high sturdiness and quality.

It is known that the package tightness is indispensable for guaranteeing protection from pollution produced by chip contamination agents that, owning to the high input voltages of approximately 200 V necessary for getting the avalanche gain, would reduce greatly the component life.

The connection efficiency between the optical fiber and APD through the glass window is ordinarily quite high, as the APD construction technique allows one to get good performances with a useful photosensitive area having a diameter comprised between 250 and 600 mm, to which corresponds a maximum distance of the fiber without connection losses comprised between 0.49 and 1.35 mm.

The classic solutions for the connection of the fiber with a detector supplied with a glass window and without a lead are numerous but not free from drawbacks. One conventional and frequently used device (used by the applicant itself) is shown in schematic section view in the FIG. 1. It is formed of a substantially cylindrical bush (BU); its lower side and hole (PA) hold the APD that terminates on its upper side with the plate of the glass window (VE). The monofiber cable (CA) with insulation (G) penetrates for a substantial depth (H) into the upper cylindrical part of the bush (BU) and continues into the lower zone without insulation as an uncovered fiber (FO) to a depth (h).

Generally, positioned between the upper cylindrical part (BU') of the bush (BU) and the passage (PA) having a smaller diameter, is a truncated conical fitting (BU"). As the drawing shows, the fiber end (FO) is kept at a very small distance from the glass (VE). The cable (A) and its appendix (FO) are secured in the position shown by filling all the inner bush volume (BU) with resin (preferably opaque in the upper part and transparent in the lower part).

The alignment of the termination end of the fiber (FO) with the APD was typically made by means of micromovements of the fiber. Among the more important drawbacks of this type of assembly are the following:

the jacket (I) between the free lower fiber end (FO) and the lower surface of the glass (VE) holds a resin stratum that, in some conditions, damages and breaks the glass (VE);

the jacket (I) height between (VE) and (FO) is notoriously critical as the maximum coupling is obtained only at a precise position.

The adjustment of (I) is not easy in the illustrated prior art arrangement. If the free fiber end is pushed too much against (VE), the fiber is bent until its breakage; on the contrary, if it is positioned far from (VE), coupling efficiency is lost.

SUMMARY OF THE INVENTION

An object of the present invention is therefore to provide a system without the above-mentioned drawbacks which allows an efficient, sure and quick coupling between the optical fiber and the photodetector.

The system according to the invention for the alignment and the assembly of one optic fiber end with a photodetector in hermetic package form with glass window and without a fiber tail is comprised of the following. One fiber end is terminated by a optical fiber support member. A support plate is provided with two cylindrical concentric seats on opposite faces. These concentric seats communicate between themselves by a common hole. The hermetically sealed photodetector is introduced into one of these seats with the glass window in an internal position and aligned with the common hole; the free end of the optical fiber support member is introduced into the other seat, whereby the optical fiber is also aligned with the plate hole. Finally, the detector device and free optical fiber support member are fixed to their respective seats in the plate by synthetic catalyzed and possibly filled resins.

These and other features and advantages of the invention will become apparent in the following description of the preferred embodiment, with reference to the accompanying drawings.

BRIEF DESCRIPTION OF THE DRAWINGS

FIG. 1 shows a prior art connection system.

FIGS. 2, 3, 4 are schematic partially sectioned views of an optical fiber terminal and, respectively, of two assemblies of this terminal with two slightly different plates.

FIGS. 3A and 4A are plan views of the plates for the assemblies of the FIGS. 3 and 4; and FIGS. 3B and 4B are traverse sections of the plates shown in the FIGS. 3A and 4A.

DETAILED DESCRIPTION OF THE PREFERRED EMBODIMENTS

Figure 3A:
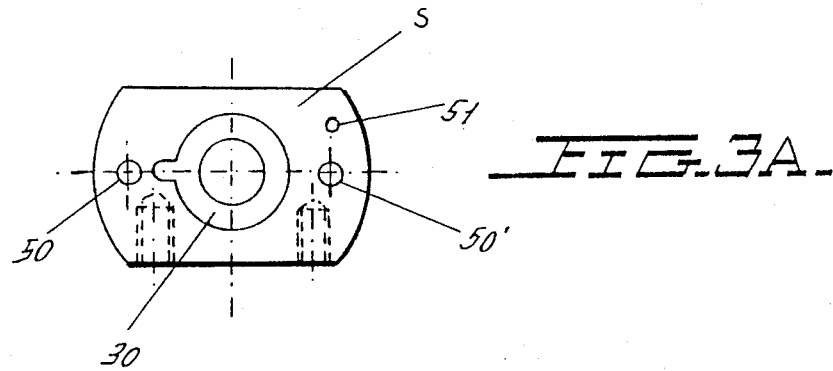

With reference to the FIGS. 2 to 4B, the system of the present invention is assembled as follows:

(A) Set-up of the optic cable

In accordance with the invention, the optical cable (CA) to be assembled to the APD is terminated at its connection end with a optical fiber support member (1) shown in enlarged scale in FIG. 2). Optical fiber support member (1) is comprised of a body including (from top to bottom) a cylindrical section (2C), having height (H2C) and an inner diameter slightly larger than the external diameter (DC) optical cable insulation; a truncated conical part (3TC) having height (H3TC) and diameter decreasing from (D2C) (substantially equal to the sheath one) to the diameter (D4R) slightly larger than the diameter of the optical fiber (FO) (without insulation); a part (4R) having height (H4R) and inner diameter (D4R) slightly larger than the external diameter of the fiber (FO); a flanged lower part (5F) having height (H5F) and external diameter (D5F); and finally a recess (6SB) in the lower face (9) of the body (1) of the optical fiber support member having height (H6SB) and diameter (D6SB). The connection between the cable (CA) and the optical fiber support member is made as follows (see also FIGS. 3 and 4):

(1) the cylindrical body (2C) (and partially the truncated cone section 3TC also) of the optical fiber support member (1) is preferably filled with epoxy resin (e.g. of the EPOTEX 302 type);

(2) the peeled fiber end (FO) is introduced into the optical fiber support member (1) until the plastic external insulation (CA) rests on the ledge (20) of the truncated cone section (3TC); generally the free end of FO enters the recess (6SB);

(3) an epoxy resin, including alumina (e.g. 0.27–0.37 gr. of alumina per 1 gr. of resin), is prepared and a drop of it is introduced into the recess or slot (6SB) of the connector (1) around the fiber hole (FO) in the component side;

(4) the resin is polymerized, e.g. at room temperature for about 1 hour or at 60 C for about 15 minutes;

(5) when the polymerization is completed, an edge surface 9 of the cylindrical optical fiber support member is made by any conventional technique such as lapping.

Figure 3B:
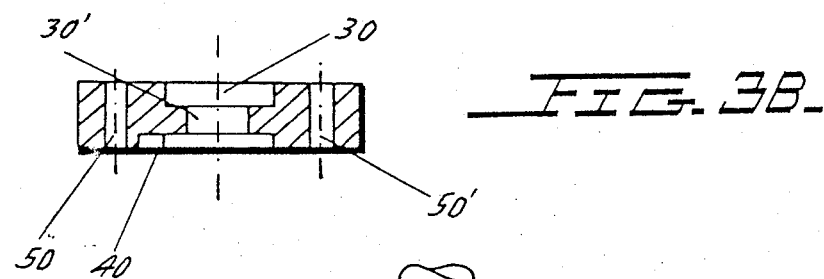
Figure 3:
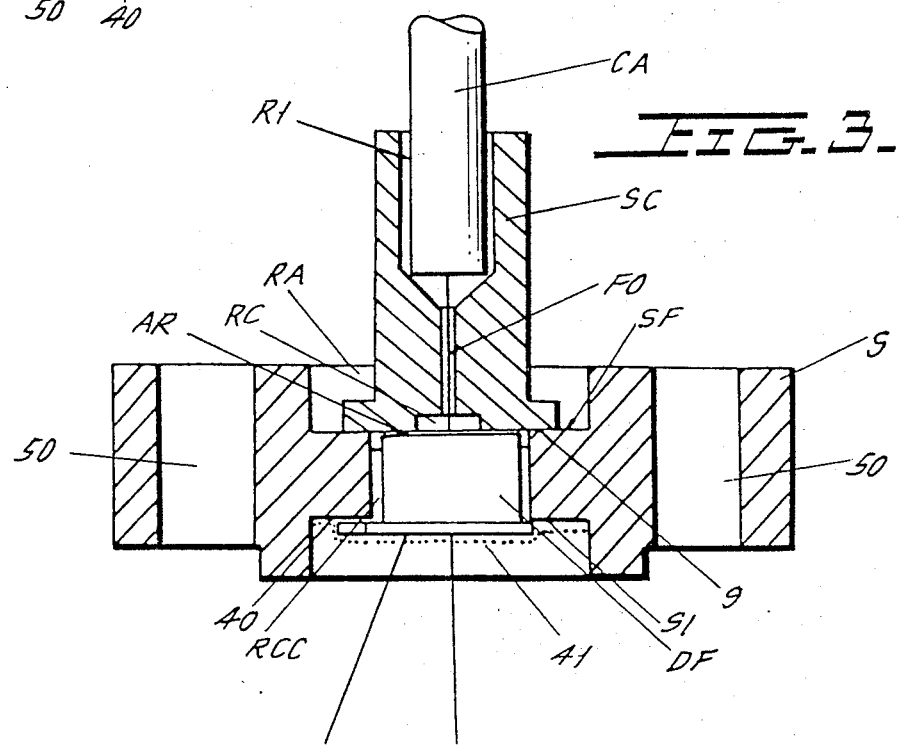

FIGS. 3 and 4 show the polymerized resin stratum applied during the phase (1) that is indicated as (RI) and the resin drop is indicated as (RC).

(B) APD Bushing (6) The first operation consists in carefully cleaning the glass (VE) of the APD, e.g. by isopropyl alcohol; for avoiding the halos produced by alcohol vaporization, the glass (VE) must be accurately dried;

(7) then the metallic package of the device (APD) is cleaned and a resin stratum of conductive silver paste is applied, which is shown in FIG. 3 as (RCC).

(8) the resin-sheathed photodetector device is introduced into the cylindrical support plate (FIGS. 3, 3A, or 4, 4A) that is substantially a plate (S) having an upper seat (SF) for holding the assembled optical fiber support member (SC) of FIG. 2 and a lower seat (SI) (40) for holding the photodetector device (DF).

Preferably, the upper and lower seats (SF) and (SI) both have a cylindrical shape and short cavities. The support (S) also has two symmetrical fastening holes (50) and (50') and a smaller threaded hole (51).

The upper seat (SF) (30) has a step shape (with either a single step (30') (FIGS. 3, 3A and 3B) or a double step (30 and 30") (FIGS. 4, 4A and 4B). The step seat (30) is thoroughly degreased before introducing the hermetic device (DF) into it. The glass (VE) of device (DF) must be in alignment with the plate (S) reference plane. For facilitating this alignment, a ground punch, placed in a ledge on the reference plane, may be used.

All the above-described parts are placed into an oven e.g. at 60° for approximately 18 hours. When the polymerization is complete, an epoxy resin is applied on the bottom (40) of the plate (S) for improving the mechanical seal between APD (DF) and support (S). A light resin stratum (41) (indicated with dots in FIG. 3) is formed. This operation also can be made in massproduction on the devices to be assembled.

(C) Assembly between APD and the optical fiber

The lower face of the flanged optical fiber support member (SC), having the drop of (RC) introduced into its recess (6SB), is inserted into the seat (30) of the support (S) plate that, as FIGS. 3 and 4 show, is much wider and taller than the flange (5F) of optical fiber support member (SC). The optic output power of the fiber (FO) placed into the cylinder (1) may be tested by use of a proper adapter for the photodetector (not shown, as it is wellknown).

After having placed the APD device into the proper seat (DI) of the support plate (S), the flanged cylindrical optical fiber support member is placed into a clamp that is aligned to assure that the axis of optical fiber support member (1) and the plate reference plane are precisely perpendicular.

The lapped cylinder (9) surface is placed against the ledge of the plate reference plane and, with movements solely in the direction transverse to the fiber axis, it is possible to optimize the alignment between the active part of the device (DF) and the fiber (FO).

The plate (S) and the cylindrical optical fiber support member (SC) are secured together by carbon-filled epoxy resin, containing, e.g., 0.35 gr. of carbon for 1 gr. of resin (RA).

An advantage of this technique over the prior art technique is that the optical fiber is introduced into the rigid body of the optical fiber support member (SC), secured by resin, and placed on a ledge on the plate (1) reference plane, thereby eliminating the necessity of correctly positioning the optical fiber in the vertical direction height.

Furthermore, the cylindrical optical fiber support member (1) with the introduced fiber (FO) is lapped, avoiding thereby the prior technique of cutting the peeled fiber, which prior technique must be carefully controlled and often requires remaking due to the delicacy of the non-protected fiber.

According to a further advantageous feature of the invention, an air stratum (AR) is applied between the fiber end (FO) in the recess (6SB) and the glass (VE) of the device in place of a resin stratum as shown in the jacket (I) of FIG. 1. The former technique disadvantageously generates a Fresnel loss in the optic connection of approximately 0.4 dB. The air stratum (AR) is minimum, therefore it is barely noticeable in FIGS. 3 and 4.

A system with components assembled conventionally as shown in FIG. 1 was compared to the described system of the present invention by testing the respective devices in environmental conditions that simulate the worst possible conditions. The tests showed that devices assembled in accordance with the conventional process often suffered breakdowns, due to the mechanical stress generated by the resin on the window (VE) of the APD.

For determining which of the devices manufactured by the prior art technique components are defective in this respect, it is necessary to submit the entire production run to a burn-in that will expose any component degradation. This burn-in involves considerable industrial costs. Therefore, it is surely advantageous and preferable to use the process of the present invention that does not result in devices having the above mentioned problems.

The sole drawback of the present invention is a loss amounting of approximately 0.4 dB, due to the reflection in the interface between glass and fiber, the air and the glass of the APD window.

The process of the present invention is suitable for an industrial production, as it advantageously requires no further screening after the assembly. The assembly has a good optic efficiency and perfect mechanical performance using a wellprotected fiber. Further, the present invention allows maximum flexibility in the selection of the connector and the photodiode type to be used.

Although the present invention has been described in connection with a preferred embodiment thereof, many other variations and modifications will now become apparent to those skilled in the art without departing from the scope of the invention. It is preferred, therefore, that the present invention be limited not by the specific disclosure herein, but only by the appended claims.

What is claimed is:

1. A process for the alignment and assembly of optical fibers to photodetectors of any commerically available structure, and in particular for connecting the glass face of a photodetector to a continuous optical fiber protected substantially along its length by an insulation covering, except for a free end of said continuous optical fiber having a section without insulation covering, said insulation covering terminating abruptly at said section to form an annular shoulder of insulation, comprising the steps of:
    (a) inserting the free end of said continuous optical fiber into an optical fiber support member having top and bottom ends with respective top and bottom surfaces, comprising from top to bottom:
    (1) a first hollow cylindrical section having an inner diameter slightly larger than the external diameter of said insulation covering:
    (2) a hollow truncated conical section having an inner surface with a diameter decreasing from said inner diameter of said first hollow cylindrical section to a diameter slightly larger than the diameter of said optical fiber without said insulation covering, said annular shoulder of insulation abutting said optical fiber support member at said hollow truncated section;
    (3) a second hollow cylindrical section having a diameter slightly larger than the diameter of said optical fiber without said insulation covering; and
    (4) a recess;
    whereby said free end of said optical fiber projects through said optical fiber support member and the section of said free end of said optical fiber without insulation terminates in said recess at said bottom surface;
    (b) inserting said photodetector into a cylindrical support plate, said plate having an upper seat and a lower seat, said photodetector being inserted into said lower seat; and
    (c) inserting the bottom surface of said optical fiber support member into the upper seat of said cylindrical support plate;
    whereby the termination of said free end of said optical fiber is centrally aligned with said glass face of said photodetector and separated from said glass face by a thin layer of air.

2. A process for the alignment and assembly of optical fibers to photodetectors as recited in claim 1, wherein the free end of said optical fiber is properly located and secured in said optical fiber support member by the steps of:
    (a) inserting the free end of the optical fiber into said optical fiber support member until the termination end of said insulation covering rests said inner surface of said truncated conical section, and the section of said free end without insulation covering projects down to the bottom surface of said optical fiber support member;
    (b) filling the hollow sections of said with epoxy and hardening resin;
    (c) applying a resin drop to said recess; and
    (d) polymerizing the resin.

3. A process for the alignment and assembly of optical fibers to photodetectors as recited in claim 1 wherein said photodetector is properly located and secured in said cylindrical support plate by the steps of:
    (a) coating said photodetector within a thin layer of resin;
    (b) inserting the photodetector into the lower seat of said cylindrical support plate;
    (c) polymerizing the resin.

4. A process for the alignment and assembly of optical fibers to photodetectors as recited in claim 3, wherein said photodetector is additionally secured in said cylindrical support plate by the steps of:
    (a) applying a light layer of resin to the bottom of said photodetector positioned in said lower seat; and
    (b) polymerizing said resin.

5. A process for the alignment and assembly of optical fibers to photodetectors as recited in claim 1, wherein said optical fiber support member and said cylindrical support plate containing said photodetector are properly secured together by the steps of:
    (a) inserting the bottom surface of said optical fiber support member into the upper seat of said cylindrical support plate;
    (b) filling the portion of the upper seat of said cylindrical support unoccupied by said optical fiber support member with resin;
    (c) polymerizing the resin.

6. A connection assembly for connecting the glass face of a photodetector of any commercially available structure to continuous optical fiber protected substantially along its length by an insulation covering, except for a free end of said continuous optical fiber having a section without insulation covering, said insulation covering terminating abruptly at said section to form an annular shoulder of insulation comprising:
    an optical fiber support member applied onto one end of said continuous optical fiber, said optical fiber support member having a first cylindrical zone with a diameter slightly greater than the insulated optical fiber;
    a truncated connection zone, said annular shoulder of insulation abutting said optical fiber support member at said truncated cone; a second cylindrical zone having a diameter slightly larger than the optical fiber without said insulation covering; and a terminal flange with a central recess;
    a support plate with first and second seats on opposite faces of said plate, said first seat cooperating with said terminal flange of said optical fiber support member and said second seat cooperating with said photodetector, said first and second seats having a cylindrical and coaxial shape and communicating with each other by a hole;
    first means for fastening said optical fiber support member to said end of said optical fiber;
    second means for fastening said flange of said optical fiber support member into said first plate seat; and
    third means for fastening said photodetector into said second seat of the said plate.

7. A connection assembly as recited in claim 6, wherein each of said first, second and third fastening means comprise polymerized resins.

* * * * *